(12) United States Patent
Ohnishi (10) Patent No.: US 11,928,178 B2
(45) Date of Patent: Mar. 12, 2024

(54) METHOD FOR CREATING WAFER SHAPE DATA

(71) Applicant: SHIN-ETSU HANDOTAI CO., LTD., Tokyo (JP)

(72) Inventor: Masato Ohnishi, Fukushima (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 582 days.

(21) Appl. No.: 17/268,326

(22) PCT Filed: Aug. 1, 2019

(86) PCT No.: PCT/JP2019/030209
§ 371 (c)(1),
(2) Date: Feb. 12, 2021

(87) PCT Pub. No.: WO2020/049911
PCT Pub. Date: Mar. 12, 2020

(65) Prior Publication Data
US 2021/0164770 A1     Jun. 3, 2021

(30) Foreign Application Priority Data
Sep. 5, 2018  (JP) ................. 2018-165807

(51) Int. Cl.
*G06F 17/17* (2006.01)
*G01B 11/06* (2006.01)
(Continued)

(52) U.S. Cl.
CPC ............. *G06F 17/17* (2013.01); *G01B 11/06* (2013.01); *G01B 21/30* (2013.01); *G06F 17/18* (2013.01)

(58) Field of Classification Search
CPC .......... G06F 17/17; G06F 17/18; G01B 21/02
See application file for complete search history.

(56) References Cited

U.S. PATENT DOCUMENTS

2002/0177980 A1* 11/2002 Sinha .................. G06T 7/66
                                                                      702/191
2005/0255610 A1   11/2005 Sato et al.
(Continued)

FOREIGN PATENT DOCUMENTS

JP     2004-20286 A    1/2004
JP     2012-501553 A   1/2012
(Continued)

OTHER PUBLICATIONS

International Search Report and Written Opinion, issued by International Searching Authority in corresponding International Application No. PCT/JP2019/030209, dated Sep. 10, 2019.

*Primary Examiner* — John C Kuan
(74) *Attorney, Agent, or Firm* — ArentFox Schiff LLP (57) ABSTRACT

A wafer is prepared, and a thickness shape of the prepared wafer at each position in a radial direction is measured for each of a predetermined number of angles into which 360 degrees of a circumference around the center of the wafer are divided. The thickness shape obtained by a measuring machine for each angle is approximated with a sixth or higher order polynomial, and a function of the wafer thickness at the position in the radial direction is created. The thickness shape outputted by the measuring machine and a thickness shape outputted by the function are compared with each other, and an error on the entire surface of the wafer is confirmed to be not greater than a predetermined error. After the confirmation, information of the function for each angle is attached to the wafer as data representing the wafer shape and supplied to a user.

4 Claims, 6 Drawing Sheets

(51) Int. Cl.
  *G01B 11/30* (2006.01)
  *G01B 21/30* (2006.01)
  *G06F 17/18* (2006.01)

(56) References Cited

U.S. PATENT DOCUMENTS

| | | | |
|---|---|---|---|
| 2007/0254386 A1* | 11/2007 | Asano | G05B 19/41875 |
| | | | 438/14 |
| 2011/0144943 A1 | 6/2011 | Veeraraghavan et al. | |
| 2012/0177282 A1 | 7/2012 | Chen et al. | |
| 2013/0284924 A1 | 10/2013 | Mizuochi et al. | |
| 2013/0305206 A1* | 11/2013 | Pandev | H01L 22/12 |
| | | | 716/136 |
| 2014/0114597 A1 | 4/2014 | Chen et al. | |

FOREIGN PATENT DOCUMENTS

| | | | | |
|---|---|---|---|---|
| JP | 2012-146581 A | | 8/2012 | |
| JP | 2014-509070 A | | 4/2014 | |
| JP | 2016-20824 A | | 2/2016 | |
| JP | 2017112316 A | * | 6/2017 | B24B 37/005 |
| JP | 2017-204609 A | | 11/2017 | |
| WO | WO2014/203961 A1 | | 12/2014 | |

* cited by examiner

METHOD FOR CREATING WAFER SHAPE DATA

CROSS-REFERENCE TO RELATED APPLICATIONS

This present application is a National Stage entry of International Application No. PCT/JP2019/030209, filed Aug. 1, 2019, which claims priority to Japanese Patent Application No. 2018-165807, filed Sep. 5, 2018. The disclosures of the prior applications are incorporated by reference in their entirety.

FIELD OF THE INVENTION

This disclosure relates to a method for creating data of a shape of a wafer with a function.

BACKGROUND OF THE INVENTION

In a case where wafers such as silicon wafers are delivered to users, a flatness parameter such as SFQR (Site Frontside ref. least sQuare Range), SBIR (Site Backside ref. Ideal Range), or ESFQR (Edge Site Frontside ref. least sQuare Range) is attached to each wafer as flatness information of the wafer. These parameters are each considered to be a substitute parameter that satisfies a certain criterion for classifying flatness of a wafer but cannot allow the shape of the wafer to be imagined. Therefore, in a stepper process, a shape of a wafer on a stage needs to be previously measured in a prestage before a device pattern is formed into the wafer.

Patent Documents 1 to 3 include disclosure associated with measurement of a shape of a wafer. Patent Document 1 discloses a method for measuring a cross-sectional shape of a workpiece such as a silicon wafer. Specifically, Patent document 1 discloses a method that includes: measuring a thickness of a workpiece being polished by a rotatable platen, with use of thickness measurement means; obtaining a plurality of thicknesses measured by the thickness measurement means and a plurality of in-plane positions of the workpiece at which the thicknesses have been measured by the thickness measurement means; converting the thickness at each in-plane position to a thickness at such a position of the workpiece in a predetermined radial direction as to correspond to a distance in a radial direction from the center of the workpiece to the in-plane position; and obtaining a cross-sectional shape of the workpiece in the predetermined radial direction. Patent Document 1 also indicates that the cross-sectional shape of the workpiece is obtained by a polynomial approximation curve.

Patent document 2 discloses a mask blank substrate that is used for producing a mask blank in which a thin film for transfer pattern formation is provided on one of main surfaces of a light-transmissive substrate. Shape fitting is performed, in a calculation region on the main surface, with an imaginary basic plane represented by Zernike polynomials consisting of terms in which the order of a variable for a radius is not greater than two, so as to obtain the mask blank substrate having such a surface shape that a difference between the maximal height and the minimal height in the calculation region in data of difference between the main surface and the imaginary basic plane is not greater than a predetermined value.

Patent document 3 discloses a method for testing a to-be-tested surface by applying light onto the to-be-tested surface of a substrate, obtaining an image of a light applying portion on the to-be-tested surface, approximating the outline of the image by a polynomial, and detecting a scattering image formed outside the outline.

CITATION LIST

Patent Document

Patent Document 1: Japanese Laid-Open Patent Publication No. 2017-204609
Patent Document 2: WO2014/203961
Patent Document 3: Japanese Laid-Open Patent Publication No. 2016-20824

SUMMARY OF INVENTION

Measurement at a prestage can be eliminated by attaching, to each wafer, all the shape data obtained during measurement of the wafer. However, a volume of data corresponding to one wafer shape is increased according to enhancement of a resolution of a flatness measuring machine, and all the shape data cannot be attached to each wafer in practice.

Furthermore, the method disclosed in Patent document 1 is for obtaining a cross-sectional shape in a predetermined radial direction (for example, X-axis direction, Y-axis direction), and, thus, is not suitable for obtaining the shape of the entire surface of the wafer. Moreover, in the method disclosed in Patent document 1, a thickness at each in-plane position is converted to a thickness at a position in a predetermined radial direction in order to obtain a cross-sectional shape in the predetermined radial direction, and an error occurs with respect to an actual cross-sectional shape in the predetermined radial direction. That is, a wafer shape cannot be obtained with high accuracy by the method disclosed in Patent document 1.

The technology of Patent document 2 is for a mask blank substrate formed as a light-transmissive substrate, and is different from technology for representing a shape of a wafer that is a thin disc-shaped plate into which a semiconductor material such as silicon is processed.

In the method disclosed in Patent document 3, the shape of an outline of an image of the light applying portion on the to-be-tested surface can be obtained. However, the method is not suitable for obtaining the shape of the entire surface of the wafer This disclosure has been made in view of the aforementioned circumstances, and an object of this disclosure is to provide a method that can reduce a volume of wafer shape data and obtain the shape data with high accuracy, and is suitable for obtaining a shape of the entire surface of the wafer.

In order to attain the aforementioned object, a method according to one aspect of this disclose is directed to a method for creating data of a shape of a wafer with a function, and the method includes: measuring a thickness shape at each position in a radial direction for each of a predetermined number of angles into which 360 degrees of a circumference around a center of the wafer are divided; creating a function of a wafer thickness at the position in the radial direction for each of the angles by sixth or higher order polynomial approximation; comparing the thickness shape outputted by a measuring machine and a thickness shape outputted by the function with each other; and setting the function for each angle to data representing the shape of the wafer after an error on an entire surface of the wafer has been confirmed to be not greater than a predetermined error.

According to one aspect of this disclosure, a function of a wafer thickness at a position in the radial direction for each angle in the circumferential direction is created, and the obtained function is set to data representing the wafer shape. Therefore, a volume can be reduced as compared with data of the thickness shape outputted by a measuring machine. The order of the polynomial in the function is not less than six, whereby an error relative to the thickness shape that is actually outputted by the measuring machine can be reduced, and shape data can be obtained with high accuracy. Furthermore, the thickness shape outputted by the measuring machine and the thickness shape outputted by the function are compared with each other, and an error on the entire surface of the wafer is confirmed to be not greater than the predetermined error. Therefore, shape data can be obtained with higher accuracy. According to one aspect of this disclosure, by increasing the number of angles into which 360 degrees of the circumference are divided, the shape data of the entire surface of the wafer can be obtained. Therefore, the method is considered to be suitable for obtaining a shape of the entire surface of a wafer.

According to one aspect of this disclosure, the angle can be not greater than 10 degrees and can preferably be not greater than one degree. In this configuration, the thickness shape of the entire surface of the wafer can be represented with high accuracy.

According to one aspect of this disclosure, thickness shapes outputted by the measuring machine for each of the angles may be averaged, and an order of a polynomial for creating the function may be determined based on a correlation coefficient obtained when the averaged thickness shape is approximated with a multi-order polynomial.

In this configuration, the order of the polynomial for creating the function is determined in consideration of a correlation coefficient, whereby shape data is likely to be obtained with high accuracy. When the thickness shape outputted by the measuring machine and the thickness shape outputted by the function are compared with each other, an error on the entire surface of the wafer is likely to be not greater than the predetermined error. The order of the polynomial is determined with use of data that is obtained by averaging the thickness shapes obtained for each of the angles by the measurement, whereby a necessary order can be easily obtained for representing the wafer shape.

According to one aspect of this disclose, the function may be created with a polynomial having an order by which the correlation coefficient is not less than 0.95. Thus, the shape data can be obtained with high accuracy.

DESCRIPTION OF EMBODIMENTS

Figure 1:
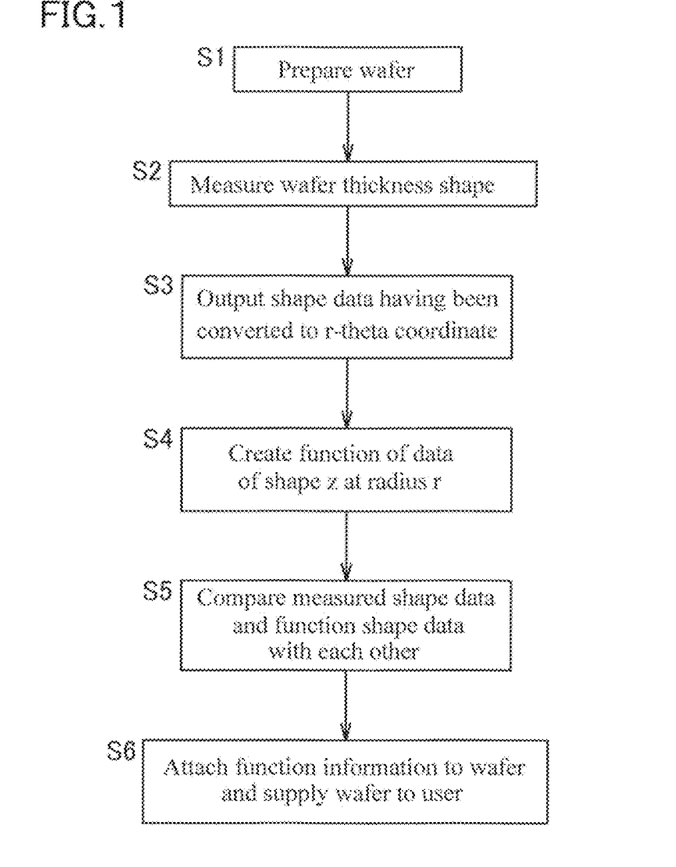
FIG. 1 is a flow chart showing a procedure for creating data of a shape of a wafer with a function.

An embodiment of this disclosure will be described below with reference to FIG. 1. Firstly, a silicon wafer (hereinafter, simply referred to as wafer) of which the thickness shape is to be represented by a function is prepared (S1).

Subsequently, the thickness shape of the prepared wafer is measured by a measuring machine such as a flatness measuring machine "WaferSight2" manufactured by KLA-Tencor (S2). At this time, a scanning (scan) range in which the measuring machine scans the wafer for measuring the thickness is the entire surface of the wafer. The scanning for measuring the thickness of the wafer may be performed in any manner. The wafer may be scanned along the wafer radial direction for each position (angle) θ in the wafer circumferential direction, the wafer may be scanned along the wafer circumferential direction for each position r in the wafer radial direction, or the wafer may be scanned along the direction parallel to an X coordinate axis or the direction parallel to a Y coordinate axis in an XY-coordinate system (orthogonal coordinate system). The measuring machine stores a coordinate of a point of the wafer at which the thickness has been measured, in association with a measured thickness value. The coordinate may be a coordinate in a coordinate system (for example, XY-coordinate system) different from a polar coordinate system in which the center of the wafer is an originating point, or may be a coordinate in a polar coordinate system in which the center of the wafer is an originating point. The measuring machine may operate based on any thickness measurement principle.

An interval (resolution) at which the measuring machine measures the thickness can be, for example, not greater than 10 degrees in the wafer circumferential direction, can be, for example, not greater than one-tenth of a diameter of the wafer in the wafer radial direction (for example, 30 mm in the case of the diameter being 300 mm), or can be not greater than 10 mm regardless of the diameter of the wafer.

Subsequently, text data (for example, csv file) of the measurement result (a measured thickness value at each point and a coordinate of the point) from the measuring machine is outputted as wafer shape data (S3). At this time, in a case where the coordinate system by the measuring machine is different from a polar coordinate system in which the center of the wafer is an originating point, the coordinate of the measurement point is converted to a polar coordinate (r-theta coordinate) for which the center of the wafer is an originating point, by using coordinate conversion software, thereby outputting the wafer shape data.

Subsequently, in the shape data (hereinafter, referred to as measured shape data) obtained in step S3, for each of a predetermined number of angles (hereinafter, each referred to as split angle θ1) into which 360 degrees of the circumference around the center of the wafer are equally divided, a function of a wafer thickness z at a position r (distance from the center of the wafer) in the radial direction is created by sixth or higher order polynomial approximation (S4). The split angle θ1 can be, for example, not greater than 10 degrees (for example, one degree), and can preferably be not greater than one degree. The split angle θ1 may be equal to the θ interval for the measured shape data. Alternatively, in a case where the interval is very small (for example, the interval is not greater than 0.1 degrees), the split angle θ1 may be greater than the interval from the viewpoint of reduction of data volume or reduction of load on the function creation.

More specifically, for each split angle θ1, the thickness z is represented by a polynomial in the form of $z=ar^n+br^{n-1}+cr^{n-2}+\ldots+const$. In the polynomial, r represents a distance from the center of the wafer (that is, a position in the radial direction). n represents the order of the polynomial (the highest order of the orders for the radius r in each term of the polynomial), and also represents an integer of not less than 6. a, b, c, and const each represent a coefficient. The coefficient in the polynomial may be determined by, for example, a least squares method. The polynomial is a one-dimensional polynomial (one variable polynomial) in which a variable for a dimension of space is the radius r only. The Zernike polynomials used in Patent Document 2 are a two-dimensional polynomial (two-variable polynomial) in which variables for a dimension include two variables that are a radius r and an angle θ.

Figure 2:
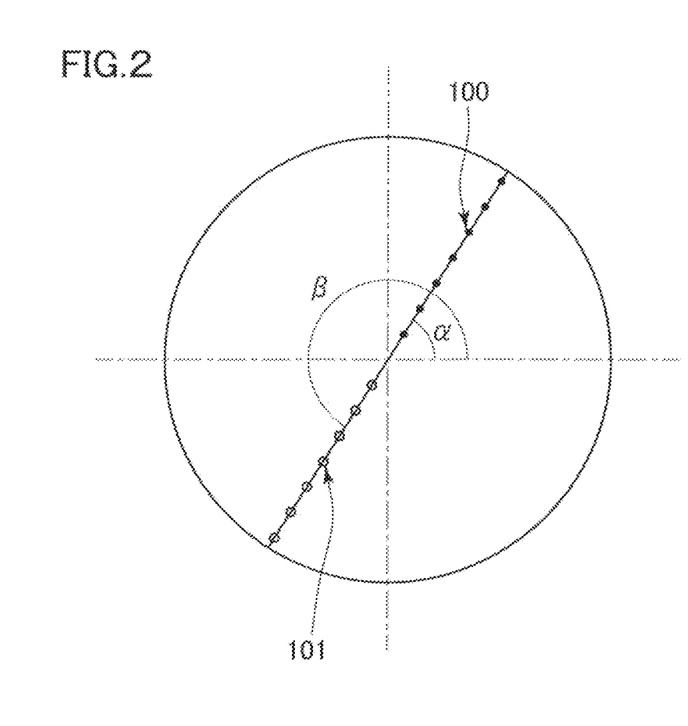
FIG. 2 illustrates, as dots, thickness data at a certain angle in a polar coordinate system in which the center of the wafer is an originating point.

For example, as shown in FIG. 2, the approximation polynomial at θ=α is calculated based on thickness data 100 for a coordinate of θ=α among the measured shape data. According to Patent Document 1, the thickness data for a coordinate other than the coordinate of θ=α is converted to thickness data at θ=α, to perform polynomial approximation. However, such a conversion is not performed in this embodiment.

In FIG. 2, when β=α+180° is satisfied, the approximation polynomial at θ=β is obtained separately from the approximation polynomial at θ=α, based on thickness data 101 for a coordinate of θ=β, among the measured shape data. Thus, in a case where 360 degrees/split angle θ1=N is satisfied, N polynomials are separately obtained in step S4.

The order of the polynomial is determined, for example, as follows. That is, in the measured shape data, data in the circumferential direction are averaged for each distance r from the center of the wafer. For example, in a case where an interval in the radial direction at which the thickness is measured is 1 mm, data in the circumferential direction for the coordinate of r=1 mm are averaged, and data in the circumferential direction for the coordinate of r=2 mm are averaged. Such averaging is performed for each distance r. A correlation coefficient R obtained when the averaged shape data is assigned to the multi-order polynomial ($z=ar^n+br^{n-1}+cr^{n-2}+\ldots+const$) is confirmed. The order of the polynomial is obtained such that the correlation coefficient R has a value (for example, not less than 0.90) that allows necessary accuracy to be assured for representing the wafer shape. In step S4, the function is created with a polynomial having the order having thus been obtained. The inventor of this disclosure has found that the correlation coefficient R is not less than 0.95 in a case where the order of the polynomial is not less than 6 (see example 1 described below).

The measured shape data used for determining the order of the polynomial may be data obtained from the wafer itself (wafer to be delivered) for which the function of the shape is created in step S4, or data obtained from another wafer (for example, a sample wafer which is not delivered). Furthermore, the order of the polynomial may be determined based on the measured shape data of a plurality of wafers. In this case, the correlation coefficient R is confirmed for each piece of the measured shape data in the above-described procedure, and an order by which all the correlation coefficients R are each not less than a predetermined value (for example, not less than 0.90) is determined as the order of the polynomial for creating the function in step S4.

In step S4, a coefficient in each term of the polynomial is outputted as information of the function (polynomial) for each split angle θ1.

Subsequently, comparison between the thickness shape (measured shape data) outputted by the measuring machine and function shape data as the thickness shape outputted by the function obtained in step S4 is performed, and whether or not an error is not greater than a predetermined error on the entire surface of the wafer is confirmed (S5). Specifically, for example, thickness shapes z (r) obtained for each split angle θ1 from the function in step S4 are compiled (integrated) to output a thickness map of one wafer. At this time, the interval at which the thickness in the radial direction is outputted is equal to the interval for the measured shape data in the radial direction. The interval can be, for example, not greater than one-tenth of the diameter of the wafer (for example, 30 mm in the case of the diameter being 300 mm) or can be not greater than 10 mm regardless of the diameter of the wafer. For example, a difference between the thickness map obtained from the function shape data and a thickness map obtained from the measured shape data is calculated, thereby obtaining a difference map. An error is confirmed to be not greater than the predetermined error in the difference map.

After the error has been confirmed to be not greater than the predetermined error on the entire surface of the wafer, the function information (coefficient data of each term of the polynomial) obtained in step S4 is attached to the wafer as data representing the wafer shape and supplied to a user (S6). The number N of the polynomials per one wafer is 360 degrees/split angle θ1, and the number of coefficients per one polynomial is (n+1) when the order of the polynomial is n. Therefore, the function information includes data corresponding to N×(n+1) coefficients per one wafer.

In a case where an error is greater than the predetermined error in a certain portion in step S5, the accuracy of the function shape data is determined as being low, and the function shape data is not adopted as shape data to be attached to the wafer. In this case, for example, the order of the polynomial is increased, and the creation of the function in step S4 is performed again, and whether or not an error is not greater than the predetermined error on the entire surface of the wafer is confirmed in step S5. In a case where the error has been confirmed to be not greater than the predetermined error on the entire surface of the wafer, the function information is attached to the wafer and supplied to a user (S6).

The user assigns the radius r and each coefficient of the polynomial attached as the function information, to ($z=ar^n+br^{n-1}+cr^{n-2}+\ldots+const$), for each split angle θ1, to obtain the thickness shape for each split angle θ1. By integrating the thickness shapes for each split angle θ1 into one, the thickness shape (thickness map) of the entire surface of the wafer can be obtained.

Thus, in this embodiment, the measured shape data of the wafer can be represented in association with r-theta coordinate. Therefore, the shape of the wafer at a certain angle can be one-dimensionally extracted, and the thickness z can be one-dimensionally represented by the radius r. Fitting is performed by the polynomial with respect to this relationship, and the shape is represented by the function in each of the angular directions, whereby the shape of the entire surface of the wafer can be represented by the function. The wafer shape obtained by the function for each angle is a three-dimensional shape having the in-plane position (r, θ)

and the thickness z of the wafer. In a case where, for example, the split angle θ1 is one degree, the information of the entire surface of the wafer can be represented by data corresponding to 360×(n+1) coefficients, and the data can be substantially compressed.

EXAMPLES

Specific descriptions will be made below by using examples. However, this disclosure is not limited to the examples.

Example 1

A relationship between an order of the polynomial and a correlation coefficient has been examined. Specifically, three silicon wafers (hereinafter, each referred to as wafer) each having a diameter of 300 mm were prepared, and the thickness shape of each wafer was measured by a flatness measuring machine "WaferSight2" manufactured by KLA-Tencor. The WaferSight2 is a measuring machine operating based on the principle in which light is incident on a wafer, and a shift amount on the surface of the wafer is measured according to the number and the widths of interference fringes generated by optical interference between light reflected by the wafer and light reflected by a basic plane.

A file (wnt file) of the measurement result outputted by the WaferSight2 was converted to a measured thickness value for the polar coordinate having an originating point at the center of the wafer, by using off-line analysis software "OASys" manufactured by KLA-Tencor, and the measured shape data having been converted was outputted as a csv file. For the measured shape data having been outputted, the θ interval (split angle θ1) was one degree, and the interval in the r direction was 0.2 mm.

Subsequently, for the measured shape data having been obtained, data in the circumferential direction were averaged for each distance r from the center of the wafer. This averaging was performed for the measured shape data for each wafer.

Figure 3:
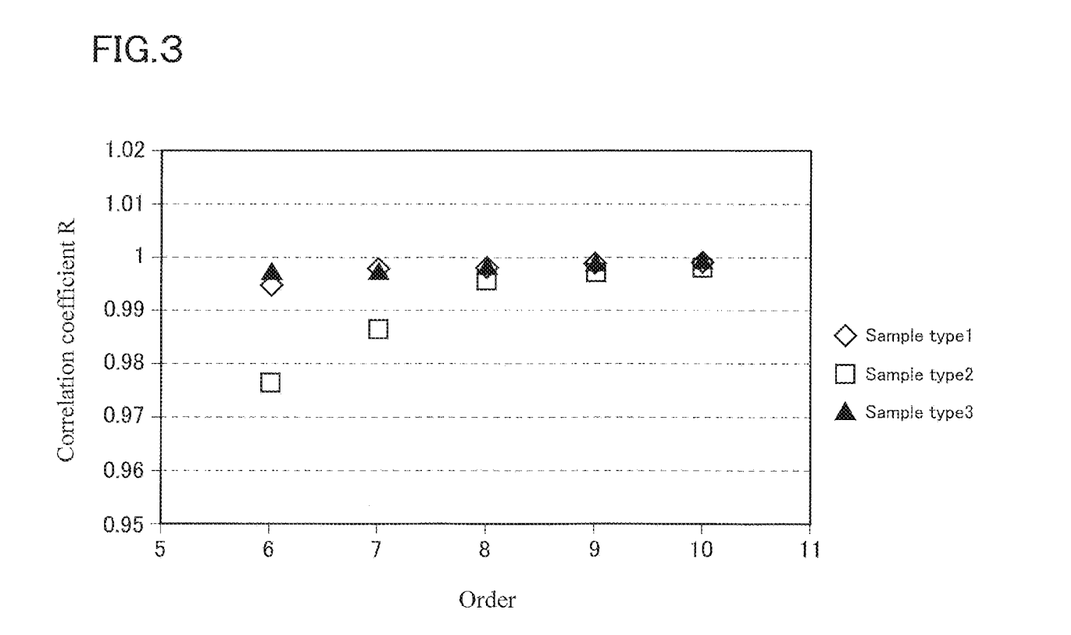
FIG. 3 illustrates relationship between orders of a polynomial and correlation coefficients in the case of a multi-order polynomial being applied to the thickness shape of a wafer in example 1.

A relationship between the correlation coefficient R and the order of the multi-order polynomial was obtained by assigning the averaged shape data for each wafer to the multi-order polynomial ($z=ar^n+br^{n-1}+cr^{n-2}+\ldots+\text{const}$) and examined. The coefficient of the polynomial was obtained by a least squares method. FIG. 3 shows the relationship.

As shown in FIG. 3, in a case where the order was six, all of the correlation coefficients R for the three wafers were each not less than 0.97. In a case where the order was seven, all of the correlation coefficients R were each not less than 0.98. Ina case where the order was not less than eight, all of the correlation coefficients R were each not less than 0.99. Particularly, in a case where the order was ten, all of the correlation coefficients R were each almost one.

The above-described results indicate that the order of the polynomial for creating the function is preferably not less than six, more preferably not less than eight by which the correlation coefficient R is not less than 0.99, and even more preferably not less than ten by which the correlation coefficient R is almost one.

Example 2

15 silicon wafers (hereinafter, each referred to as wafer) each having a diameter of 300 mm were prepared, and creation of the function was performed for each wafer according to the procedure shown in FIG. 1, and the thickness map from the obtained function and the thickness map outputted from a measuring machine were compared with each other. Specifically, the thickness shape of each wafer was measured by the flatness measuring machine "WaferSight2" manufactured by KLA-Tencor.

A file (wnt file) of the measurement result outputted by the WaferSight2 was converted to a measured thickness value for the polar coordinate having an originating point at the center of the wafer, by using off-line analysis software "OASys" manufactured by KLA-Tencor, and the measured shape data having been converted was outputted as a csv file. For the measured shape data having been outputted, the θ interval (split angle θ1) was one degree, and the interval in the r direction was 0.2 mm.

Approximation was performed for each piece of the measured shape data with a tenth-order polynomial for the position r (distance from the center of the wafer) in the radial direction for each split angle θ1. The coefficients of the polynomial were obtained by a least squares method. Each of the obtained coefficients of the polynomial for each split angle θ1 was outputted. Table 1 indicates each coefficient of the polynomial obtained from one of the 15 wafers. In the function information indicated in Table 1, the number of the polynomials was 360 and the number of the coefficients per one polynomial was 11, and data corresponding to 360×11=3960 coefficients were included in total.

TABLE 1

| theta | a<br>Coefficient<br>for tenth<br>order term | b<br>Coefficient<br>for ninth<br>order term | c<br>Coefficient<br>for eighth<br>order term | d<br>Coefficient<br>for seventh<br>order term | e<br>Coefficient<br>for sixth<br>order term | f<br>Coefficient<br>for fifth<br>order term |
|---|---|---|---|---|---|---|
| 0 | −5.43E−17 | 3.84E−14 | −1.14E−11 | 1.85E−09 | −1.76E−07 | 9.98E−06 |
| 1 | −4.57E−17 | 3.19E−14 | −9.28E−12 | 1.47E−09 | −1.35E−07 | 7.26E−06 |
| 2 | −3.86E−17 | 2.66E−14 | −7.68E−12 | 1.19E−09 | −1.07E−07 | 5.53E−06 |
| 3 | −5.04E−17 | 3.51E−14 | −1.02E−11 | 1.61E−09 | −1.50E−07 | 8.17E−06 |
| 4 | −4.76E−17 | 3.27E−14 | −9.39E−12 | 1.45E−09 | −1.30E−07 | 6.77E−06 |
| 5 | −4.98E−17 | 3.40E−14 | −9.66E−12 | 1.47E−09 | −1.30E−07 | 6.49E−06 |
| . | | | | | | |
| . | | | | | | |
| . | | | | | | |
| 353 | −6.38E−17 | 4.56E−14 | −1.37E−11 | 2.23E−09 | −2.16E−07 | 1.25E−05 |
| 354 | −7.20E−17 | 5.23E−14 | −1.59E−11 | 2.66E−09 | −2.63E−07 | 1.57E−05 |
| 355 | −7.48E−17 | 5.43E−14 | −1.66E−11 | 2.76E−09 | −2.74E−07 | 1.64E−05 |

TABLE 1-continued

| | | | | | |
|---|---|---|---|---|---|
| 356 | −6.99E−17 | 5.05E−14 | −1.53E−11 | 2.54E−09 | −2.50E−07 | 1.48E−05 |
| 357 | −5.31E−17 | 3.83E−14 | −1.16E−11 | 1.90E−09 | −1.85E−07 | 1.08E−05 |
| 358 | −5.21E−17 | 3.73E−14 | −1.12E−11 | 1.84E−09 | −1.78E−07 | 1.03E−05 |
| 359 | −4.67E−17 | 3.34E−14 | −9.98E−12 | 1.62E−09 | −1.56E−07 | 8.89E−06 |

| theta | g Coefficient for fourth order term | h Coefficient for third order term | i Coefficient for second order term | j Coefficient for first order term | Const. Coefficient (constant) for zeroth order term |
|---|---|---|---|---|---|
| 0 | −3.23E−04 | 5.38E−03 | −4.09E−02 | −1.87E−01 | 7.75E+05 |
| 1 | −2.12E−04 | 2.75E−03 | −7.93E−03 | −3.55E−01 | 7.75E+05 |
| 2 | −1.47E−04 | 1.34E−03 | 7.81E−03 | −4.21E−01 | 7.75E+05 |
| 3 | −2.48E−04 | 3.57E−03 | −1.82E−02 | −2.88E−01 | 7.75E+05 |
| 4 | −1.86E−04 | 2.05E−03 | 3.19E−04 | −3.74E−01 | 7.75E+05 |
| 5 | −1.65E−04 | 1.32E−03 | 1.18E−02 | −4.37E−01 | 7.75E+05 |
| . | | | | | |
| . | | | | | |
| . | | | | | |
| 353 | −4.21E−04 | 7.82E−03 | −7.94E−02 | 8.38E−02 | 7.75E+05 |
| 354 | −5.54E−04 | 1.09E−02 | −1.15E−01 | 2.46E−01 | 7.75E+05 |
| 355 | −5.76E−04 | 1.13E−02 | −1.18E−01 | 2.25E−01 | 7.75E+05 |
| 356 | −5.18E−04 | 1.00E−02 | −1.02E−01 | 1.41E−01 | 7.75E+05 |
| 357 | −3.62E−04 | 6.59E−03 | −6.30E−02 | −4.79E−02 | 7.75E+05 |
| 358 | −3.44E−04 | 6.26E−03 | −6.02E−02 | −5.72E−02 | 7.75E+05 |
| 359 | −2.91E−04 | 5.08E−03 | −4.65E−02 | −1.23E−01 | 7.75E+05 |

The thickness $z(r)$ for each split angle $\theta 1$ (=one degree) was outputted based on the obtained function (polynomial). The thicknesses $z(r)$ were compiled (integrated) into one, to output the thickness map of one wafer. The thickness map of each of the 15 wafers was outputted.

Figure 4:
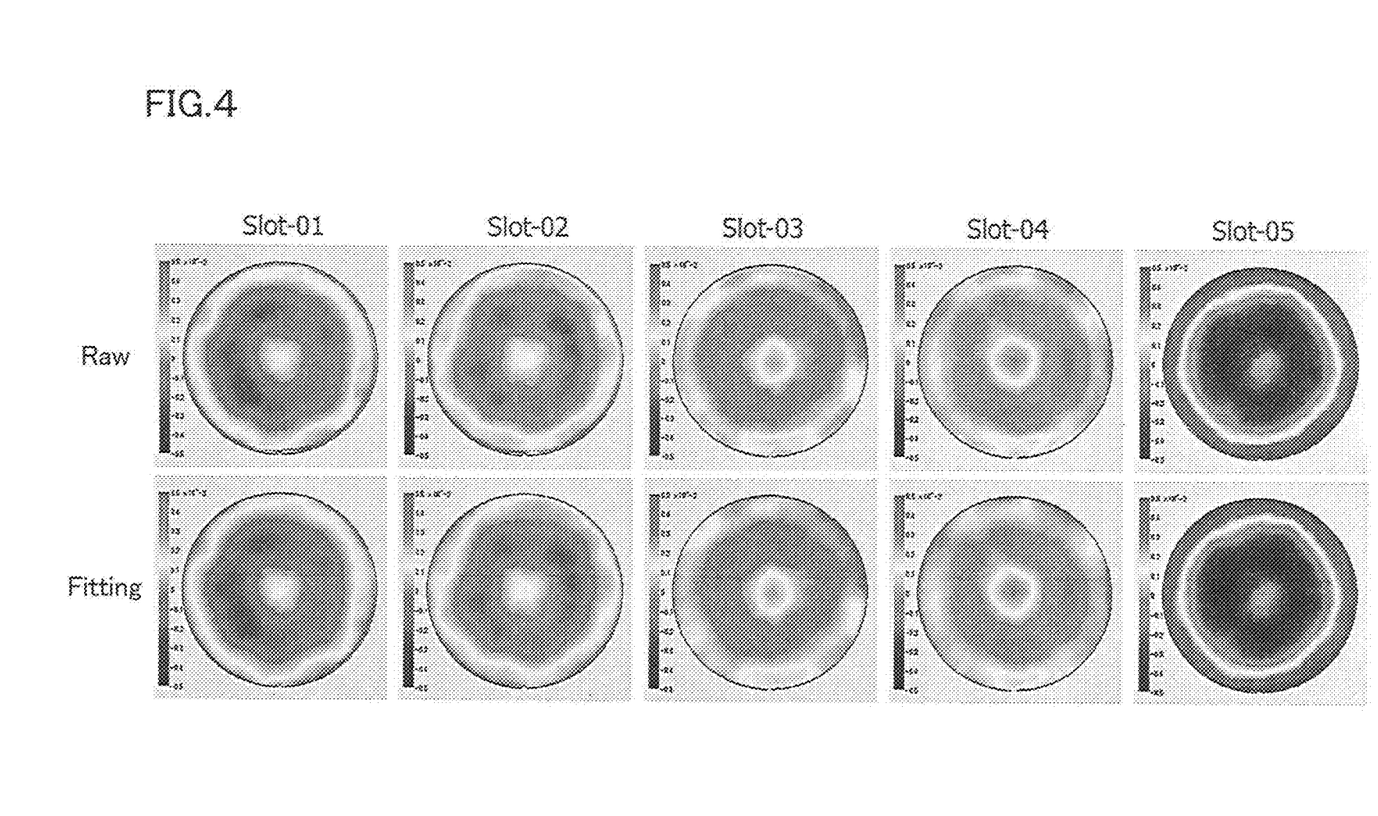
FIG. 4 illustrates thickness maps outputted by a measuring machine on the upper side portion, and illustrates thickness maps outputted by a function on the lower side portion, for a first to a fifth wafers of example 2.
Figure 5:
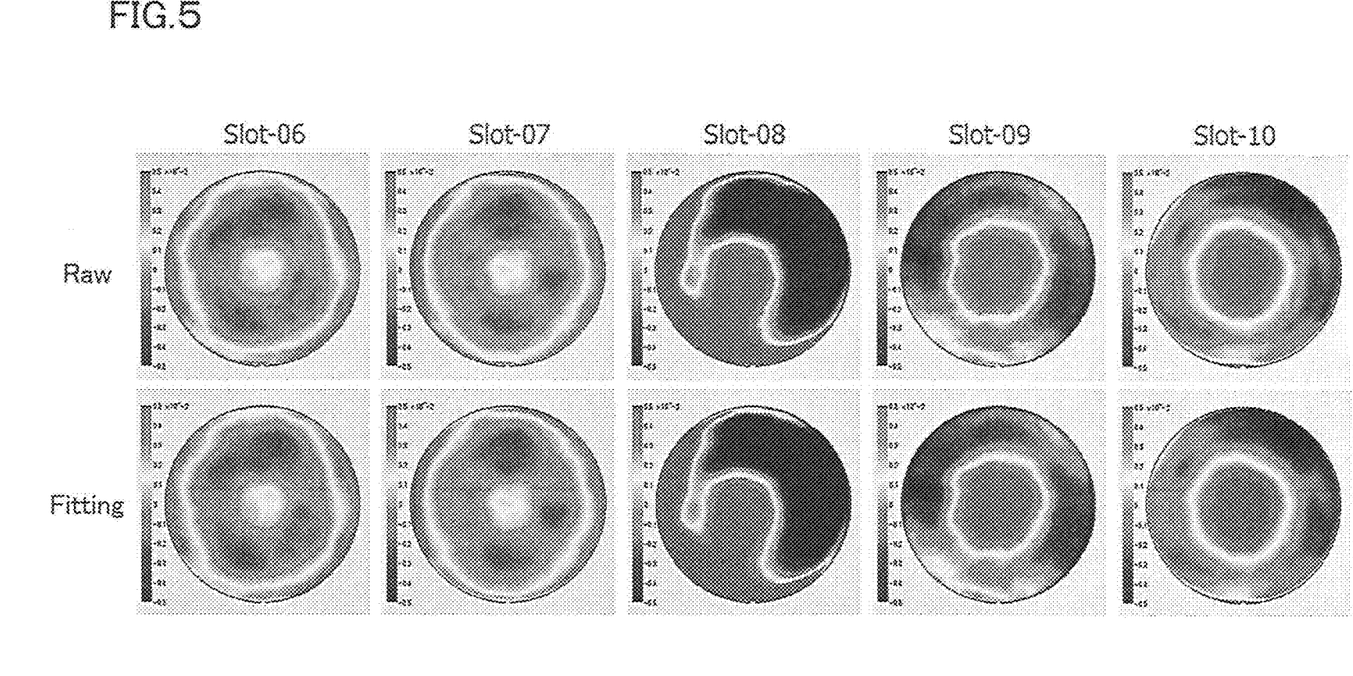
FIG. 5 illustrates thickness maps outputted by the measuring machine on the upper side portion, and illustrates thickness maps outputted by the function on the lower side portion, for a sixth to a tenth wafers of example 2.
Figure 6:
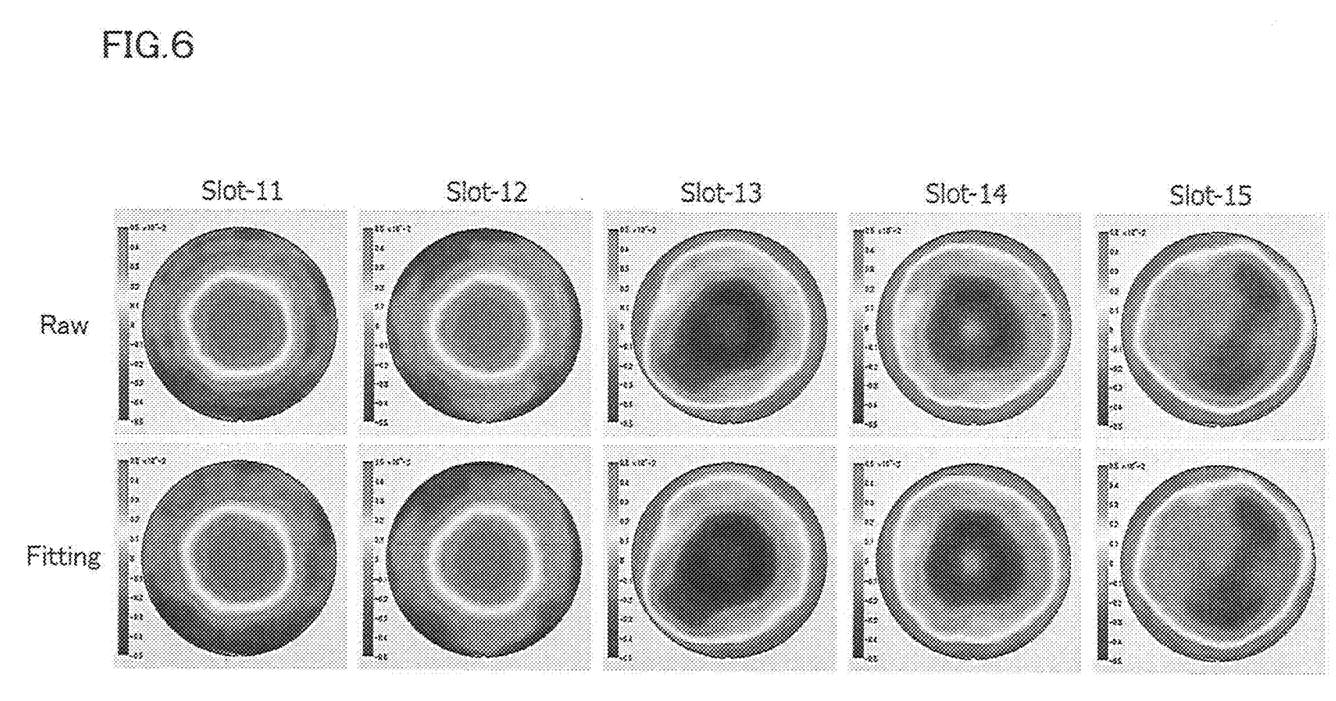
FIG. 6 illustrates thickness maps outputted by the measuring machine on the upper side portion, and illustrates thickness maps outputted by the function on the lower side portion, for an eleventh to a fifteenth wafers of example 2.

FIG. 4 to FIG. 6 illustrate thickness maps (maps indicated as "Raw") outputted by the measuring machine on the upper side portions, and illustrate thickness maps (maps indicated as "Fitting") outputted by the function on the lower side portions, for the 15 wafers, respectively. In FIG. 4 to FIG. 6, the interval, in the radial direction, for the thickness data based on which each thickness map was obtained was 0.2 mm. In each of the thickness maps shown in FIG. 4 to FIG. 6, a shift amount of the basic plane was zero, and a shift amount relative to the basic plane was represented by gray gradation.

As shown in FIG. 4 to FIG. 6, in all of the wafers, the thickness map outputted by the function was analogous to the thickness map outputted by the measuring machine, and the thickness shape of the wafer is considered to be accurately represented. In practice, by comparison between the thickness map on the upper side portion and the thickness map on the lower side portion for each wafer, it was confirmed that the error on the entire surface of the wafer was not greater than ±5.5 nm (the predetermined error) in all of the wafers.

According to comparison in volume between the shape data outputted by the measuring machine "WaferSight2" and the function information, the volume of the shape data outputted by the measuring machine was 2 to 20 Mb per one wafer, whereas the volume of the function information was 63 kb per one wafer. The volume was significantly compressed by creating the function.

This disclosure is not limited to the above-described embodiment. The embodiment is merely an example, and any embodiment having substantially the same configuration and having the same operational effects as those of the technical idea described in this disclosure is included in the technical scope of this disclosure.

The invention claimed is:

1. A method for creating wafer shape data in which data of a shape of a wafer is created with a function, the method comprising:
    measuring a thickness shape at a position in a radial direction for each of a predetermined number of angles into which 360 degrees of a circumference around a center of the wafer are divided;
    creating a function of a wafer thickness at the position in the radial direction for each of the angles by sixth or higher order polynomial approximation;
    comparing the thickness shape outputted by a measuring machine and a thickness shape outputted by the function with each other, for each of the angles; and
    setting the function for each of the angles to data representing the shape of the wafer after an error on an entire surface of the wafer has been confirmed to be not greater than a predetermined error; and
    wherein thickness shapes outputted by the measuring machine for each of the angles are averaged, and an order of a polynomial for creating the function for each of the angles is determined based on a correlation coefficient obtained when the averaged thickness shape for each of the angles is approximated with a multi-order polynomial.

2. The method for creating wafer shape data according to claim 1, wherein each of the angles is not greater than 10 degrees.

3. The method for creating wafer shape data according to claim 1, wherein each of the angles is not greater than one degree.

4. The method for creating wafer shape data according to claim 1, wherein the function for each of the angles is created with a polynomial having an order by which the correlation coefficient is not less than 0.95.

* * * * *